United States Patent
Lin et al.

(10) Patent No.: US 11,171,065 B2
(45) Date of Patent: Nov. 9, 2021

(54) AUTOMATED INSPECTION TOOL

(71) Applicant: Taiwan Semiconductor Manufacturing Co., Ltd., Hsin-Chu (TW)

(72) Inventors: Chia-Han Lin, New Taipei (TW); Chien-Fa Lee, Hsinchu (TW); Hsu-Shui Liu, Pingjhen (TW); Jiun-Rong Pai, Jhubei (TW); Sheng-Hsiang Chuang, Hsin-Chu (TW); Surendra Kumar Soni, Hsinchu (TW); Shou-Wen Kuo, Hsinchu (TW); Wu-An Weng, Hsinchu (TW); Gary Tsai, Hsin-Chu (TW); Chien-Ko Liao, Taichung (TW); Ya Hsun Hsueh, Yunlin County (TW); Becky Liao, Taichung (TW); Ethan Yu, Changhua (TW); Ming-Chi Tsai, Hsin-Chu (TW); Kuo-Yi Liu, Chiayi (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/600,789

(22) Filed: Oct. 14, 2019

(65) Prior Publication Data

US 2020/0043812 A1 Feb. 6, 2020

Related U.S. Application Data

(63) Continuation of application No. 15/904,795, filed on Feb. 26, 2018, now Pat. No. 10,490,463.

(Continued)

(51) Int. Cl.
*H01L 21/66* (2006.01)
*H05K 13/08* (2006.01)
(Continued)

(52) U.S. Cl.
CPC .......... *H01L 22/12* (2013.01); *G06K 9/2063* (2013.01); *H01L 21/67017* (2013.01);
(Continued)

(58) Field of Classification Search
CPC .............. H01L 22/12; H01L 21/68764; H01L 21/6776; H01L 21/67288; H01L 21/67017;
(Continued)

(56) References Cited

U.S. PATENT DOCUMENTS 4,764,969 A * 8/1988 Ohtombe .............. G06T 7/0004
   382/148
6,583,414 B2    6/2003 Nozoe et al.
(Continued)

OTHER PUBLICATIONS

Notice of Allowance dated Jul. 25, 2019 for U.S. Appl. No. 15/904,795.

*Primary Examiner* — James M Pontius
(74) *Attorney, Agent, or Firm* — Eschweiler & Potashnik, LLC

(57) ABSTRACT

Some embodiments of the present disclosure relate to a processing tool. The tool includes a housing enclosing a processing chamber, and an input/output port configured to pass a wafer through the housing into and out of the processing chamber. A back-side macro-inspection system is arranged within the processing chamber and is configured to image a back side of the wafer. A front-side macro-inspection system is arranged within the processing chamber and is configured to image a front side of the wafer according to a first image resolution. A front-side micro-inspection system is arranged within the processing chamber and is configured to image the front side of the wafer according to a second image resolution which is higher than the first image resolution.

20 Claims, 7 Drawing Sheets

Related U.S. Application Data

(60) Provisional application No. 62/539,019, filed on Jul. 31, 2017.

(51) Int. Cl.
*G06K 9/20* (2006.01)
*H01L 21/67* (2006.01)
*H01L 21/687* (2006.01)
*H01L 21/677* (2006.01)

(52) U.S. Cl.
CPC .... *H01L 21/6776* (2013.01); *H01L 21/67288* (2013.01); *H01L 21/68764* (2013.01); *H01L 22/24* (2013.01); *H05K 13/08* (2013.01); *G06K 2209/01* (2013.01)

(58) Field of Classification Search
CPC ...... H01L 22/24; H05K 13/08; G06K 9/2063; G06K 2209/01
See application file for complete search history.

(56) References Cited

U.S. PATENT DOCUMENTS

| | | | |
|---|---|---|---|
| 6,611,728 B1* | 8/2003 | Morioka | G01N 21/9501 257/E21.525 |
| 6,809,809 B2 | 10/2004 | Kinney et al. | |
| 7,593,565 B2 | 9/2009 | Reich et al. | |
| 7,616,804 B2 | 11/2009 | Pai et al. | |
| 9,286,675 B1* | 3/2016 | Shabtay | G06K 9/52 |
| 10,490,463 B2* | 11/2019 | Lin | H01L 21/6776 |
| 2002/0130262 A1* | 9/2002 | Nakasuji | H01J 37/185 250/311 |
| 2003/0122146 A1* | 7/2003 | Iijima | H01L 21/67383 257/100 |
| 2004/0012775 A1* | 1/2004 | Kinney | G01N 21/9501 356/237.2 |
| 2008/0013822 A1 | 1/2008 | Pai et al. | |
| 2012/0113243 A1* | 5/2012 | Srocka | H01L 21/67288 348/79 |
| 2012/0116567 A1* | 5/2012 | Hayakawa | H01L 21/67178 700/105 |
| 2014/0219544 A1 | 8/2014 | Wu et al. | |
| 2014/0233838 A1 | 8/2014 | Amzaleg et al. | |

* cited by examiner

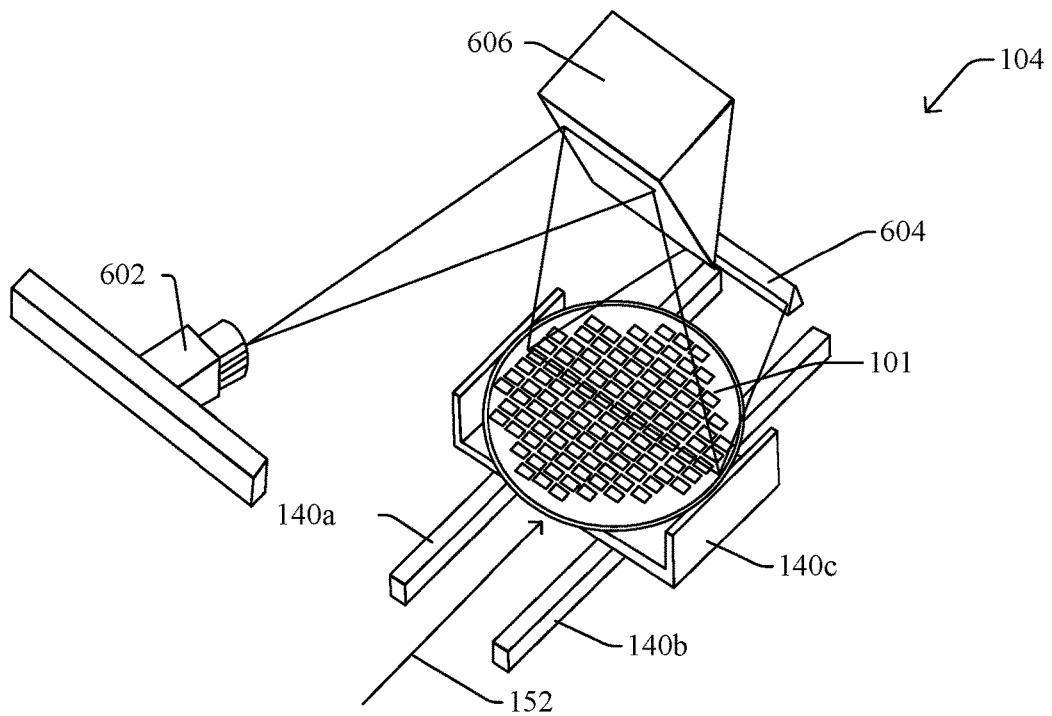
Fig. 6
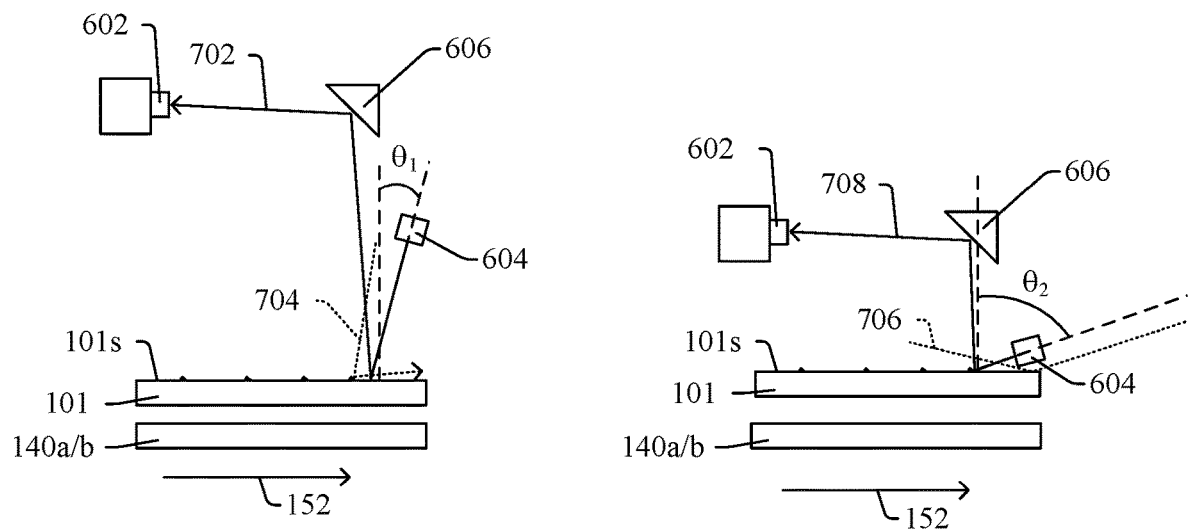
Fig. 7　　　　　Fig. 8

AUTOMATED INSPECTION TOOL

REFERENCE TO RELATED APPLICATION

This Application is a Continuation of U.S. application Ser. No. 15/904,795, filed on Feb. 26, 2018, which claims the benefit of U.S. Provisional Application No. 62/539,019, filed on Jul. 31, 2017. The contents of the above referenced Patent Applications are hereby incorporated by reference in their entirety.

BACKGROUND

Modern day integrated chips comprise millions or billions of semiconductor devices formed on a semiconductor substrate (e.g., silicon). To improve functionality of integrated chips, the semiconductor industry has continually reduced the dimension of semiconductor devices to provide for integrated chips with small, densely populated devices. By forming integrated chips having small, densely populated devices, the speed of the semiconductor devices increases as the power consumption of devices decreases. However, as the density of integrated chip devices increases, the failure rate of integrated chips due to contamination also goes up. One cause of this increased failure rate is the exposure of a wafer to airborne molecular contaminants (e.g., dust particles in the air).

To minimize integrated chip failure due to contaminants, fabrication facilities take great care to limit exposure of wafers to contaminant particles. For example, modern day integrated chips are formed in clean rooms having a low level of environmental pollutants. For example, an ISO 1 cleanroom contains no particles having a size of greater than or equal to 0.5 um (in comparison to ambient air outside, which contains approximately 35,000,000 particles of that size per cubic meter). Integrated chips are also transported between tools in a clean room using closed wafer carriers that further decrease exposure of an integrated chip to contaminants.

Ideally, wafers will ship to external customers with no defects or contaminants. However, in reality, some nominal level of defects and/or contamination cannot be entirely avoided. To measure the level of defects and/or contamination present on each wafer, outgoing quality assurance (OQA) processes are used on the final wafers just before the wafers are shipped.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

FIG. 6 is a schematic diagram of a macro imaging system, which can be used to image a front side of a wafer, in accordance with one or more embodiments.

FIG. 7 shows an example of how the macro imaging system of FIG. 6 can be used to perform bright field imaging.

FIG. 8 shows an example of how the macro imaging system of FIG. 6 can be used to perform dark field imaging.

DESCRIPTION

Figure 1:
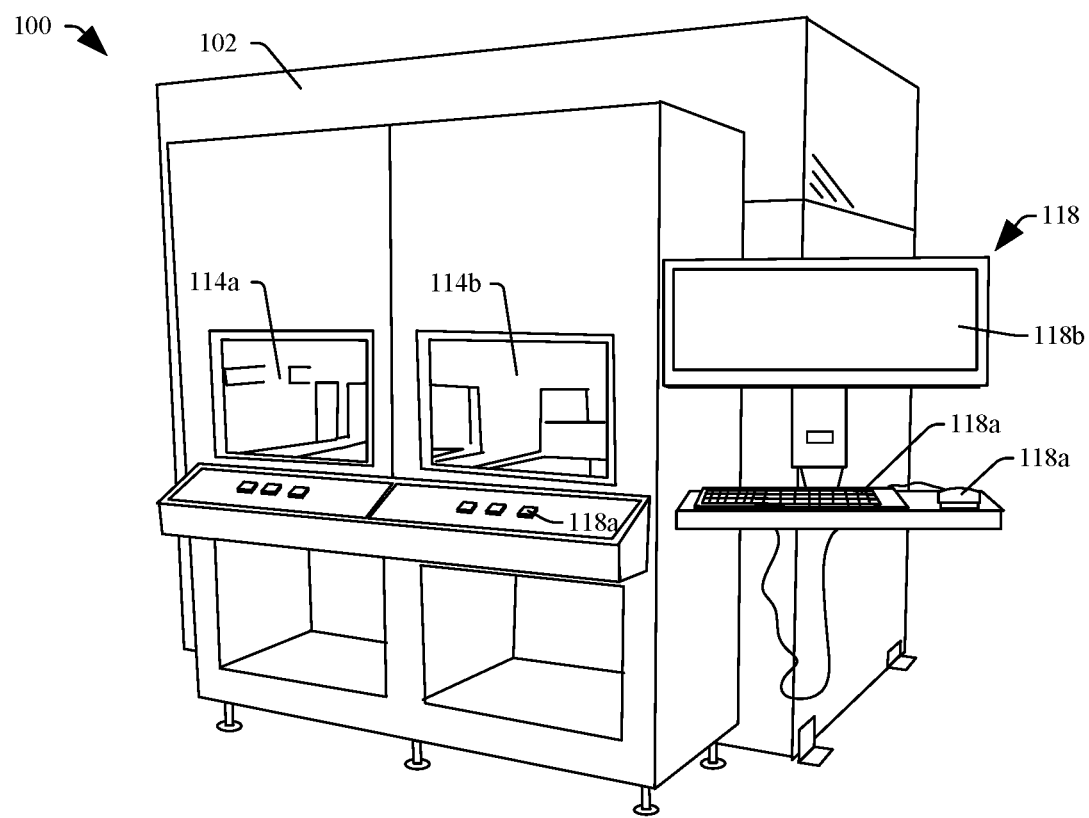
FIG. 1 is a perspective view illustrating a housing, input and output ports, and a controller interface of an automated inspection tool, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, it will be appreciated that the terms "first", "second", "third", "fourth", and the like, are merely generic identifiers, and as such may be interchanged in various embodiments, such that a "first" element in one context may correspond to a "second" element, "third" element, etc., in other contexts. In addition, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Outgoing quality assurance (OQA) processes are used to evaluate to what extent defects are present on a semiconductor wafer. For example, OQA can be used to visually inspect and detect particle contaminants on the wafer, scratches on the wafer, arcing between features on the wafer, and/or other damage on the surface of the wafer. Traditional OQA processes are labor intensive in that they require a technician to pick-up a wafer carrier, open the wafer carrier to remove a wafer, use one or more optical viewing tools to manually inspect the wafer for defects, then replace the wafer in the wafer carrier, before doing the same for other wafers in the wafer carrier. Such a process is costly in terms of hourly wages and also due to the fact that human handling/transport of wafers tends to increase breakage, contaminants, and/or defects. Thus, traditional OQA techniques are less than ideal.

Accordingly, some aspects of the present disclosure provide for automated inspection tools and corresponding techniques by which wafers can be inspected with limited, if any, human handling/transport. As such, these automated inspection tools limit labor costs and also minimize breakage, contamination, and defects for wafers as they are being evaluated.

FIG. 1 is a perspective view of an automated inspection tool 100 in accordance with one or more embodiments. As will be appreciated in more detail below, the automated inspection tool 100 includes several functions within its housing 102. By including these functions within its housing, the automated inspection tool 100 streamlines wafer processing and/or testing, limits exposure to contaminants, and reduces risk of wafer breakage compared to previous manual approaches. The housing 102 is a generally box-like enclosure that encloses the various assemblies/systems of the automated inspection tool. The housing 102 is typically made of sheet metal, and includes an input port 114a through which inbound wafers can be received, and an output port 114b through which outgoing wafers pass.

In the embodiment of FIG. 1, the input port 114a and output port 114b are arranged on the same side of the housing 102, but in other embodiments the input port and output port can be arranged on different sides of the housing. The input port 114a includes an input port opening in the sheet metal of the housing 102, wherein a clear glass or clear polymer door is positioned over the input port opening to seal (e.g., hermetically seal) an processing chamber of the housing 102 from the external wafer fab environment. Similarly, the output port 114b includes an output port opening in the sheet metal of the housing, wherein a clear glass or clear polymer door is positioned over the output port opening to seal (e.g., hermetically seal) the processing chamber of the housing 102 from the external wafer fab environment. The input port 114a and/or output port 114b are each configured to receive a movable input/output wafer carrier, such as a front opening unified pod (FOUP) or a standard mechanical interface (SMIF) pod. Although FIG. 1 illustrates an embodiment that includes an input port 114a for incoming wafers and a separate output port 114b for outgoing wafers, in other embodiments automated inspection tools can include only a single input/output port that is shared for incoming and outgoing wafers.

A controller interface 118 allows a user to run diagnostics on the automated inspection tool 100, change operating routines of the automated inspection tool 100, and/or monitor results of previous operations, current operations, or future operations provided by the automated inspection tool 100. The controller interface 118 includes a control element, such as a microcontroller; a data user input element 118a, such as a keyboard, mouse, touchscreen, and/or microphone; and a data user display element 118b, such as a monitor or other visual and/or audio output device.

Figure 2:
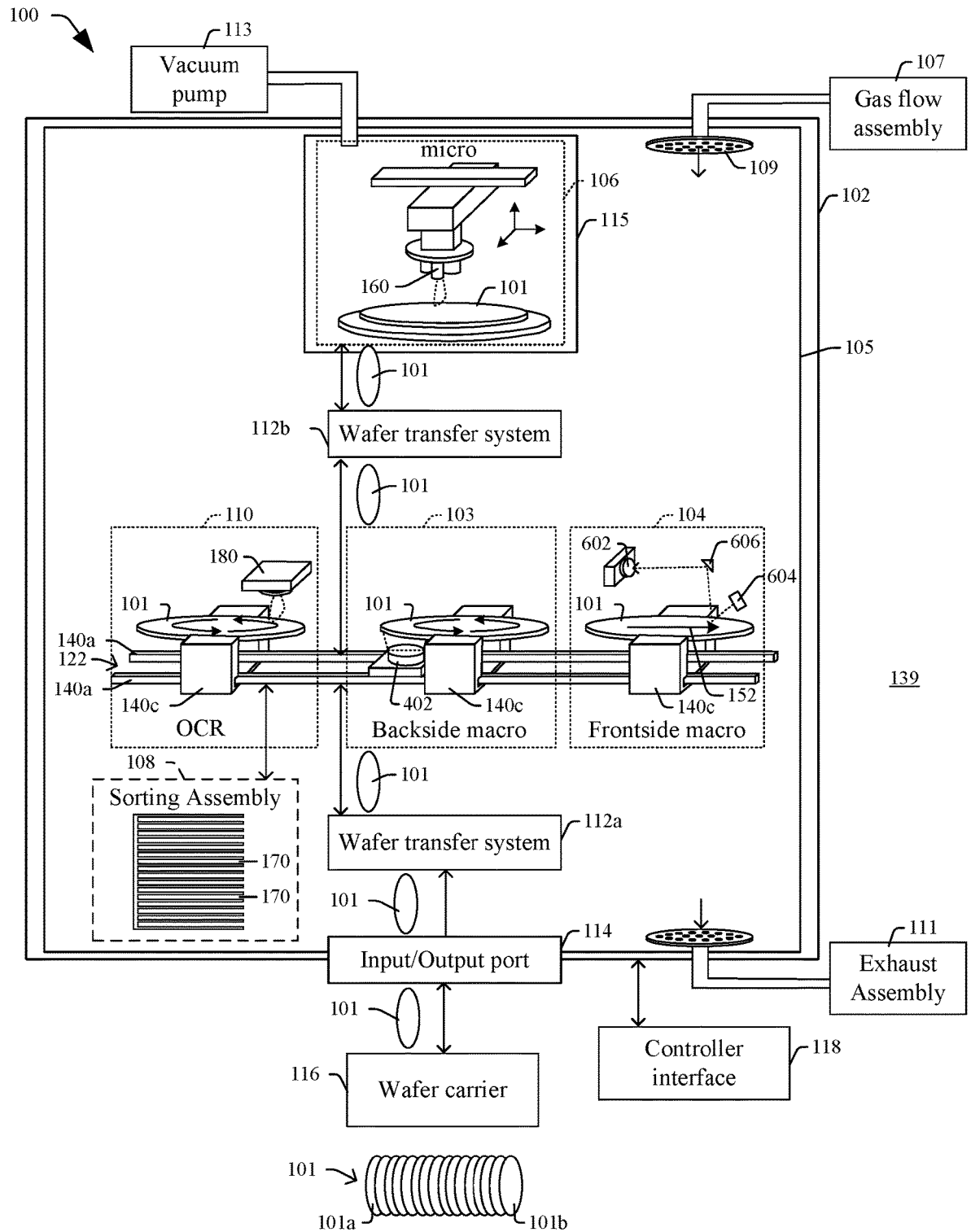
FIG. 2 is a block diagram of an automated inspection tool in accordance with one or more embodiments.

FIG. 2 shows a block diagram of the automated inspection tool 100. Wafers can be loaded into the processing chamber 105 through input/output port 114, which can be made up of an input opening and a separate output opening in some embodiments (see e.g., 114a and 114b in FIG. 1) or can consist of a single opening in the housing in other embodiments.

As illustrated, the housing 102 encloses a processing chamber 105 in which various assemblies/systems are provided. The housing 102 can also enclose a vacuum chamber 115 that lies within the processing chamber 105. A vacuum pump 113 can pump the vacuum chamber 115 down to vacuum. A down-draft assembly can be used to generate downward gas flow that is aimed to direct any contaminant particles downward and away from the surface of wafers being processed. To achieve down-drafting, a gas flow assembly 107, which can include a showerhead 109 within an upper region of the processing chamber 105, provides gas flow from the upper region of the processing chamber 105, and an exhaust assembly 111, which typically includes a fan, is arranged in a bottom region of the housing and draws gas outward from the processing chamber 105.

Within the processing chamber 105, the automated inspection tool 100 includes hardware to implement at least four discrete functions. The four functions in the automated inspection tool 100 are as follows: a backside macro-inspection system 103, a front side macro-inspection system 104, a front side micro-inspection system 106, and a sorting assembly 108. The automated inspection tool 100 also includes an optical character recognition (OCR) assembly 110, for example to read wafer identifiers from wafers as the wafers are processed, and a wafer transfer system for transferring/transporting wafers to or from the various assemblies. The wafer transfer system is illustrated as including a first wafer transfer system 112a and a second wafer transfer system 112b, which are arranged in separate regions of the processing chamber 105. A gantry system 122 also helps transport the wafers between the various assemblies/systems.

During operation of the automated inspection tool 100, the controller interface 118 is configured to control the backside macro-inspection system 103; the front side macro-inspection system 104; the front side micro-inspection system 106; the sorting assembly 108; the OCR assembly 110; the wafer transfer systems 112a, 112b; the gantry system 122; the gas inflow assembly 107; the exhaust assembly 111; and the vacuum pump 113. The controller interface 118 can include a memory and a microprocessor, as well as servos, actuators, and the like to facilitate the operation described below.

Operation of the automated inspection tool 100 is now described with reference to FIG. 3, which shows a flow diagram 300 in accordance with some embodiments. It will be appreciated that although the flow diagram 300 is described with respect to the automated inspection tool 100 of FIG. 2, the flow diagram 300 is a non-limiting example and other variations are contemplated as falling within the scope of this disclosure. While the disclosed method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Flow diagram 300 starts at 302 when one or more semiconductor wafers are loaded from an input port of the automated inspection tool through the housing of the tool and onto a gantry system within the processing chamber of the tool. In some embodiments, each wafer includes a front side on which one or more semiconductor devices are formed, and a backside which is devoid of semiconductor devices. With regards to the automated inspection tool 100 of FIG. 2, at the onset of operation, step 302 can be implemented when a wafer carrier 116 is placed on a first loading port of the automated inspection tool 100, and the input port 114 (e.g., clear glass or polymer door over an opening in housing 102) is opened. The wafer carrier 116 is then opened (e.g., wafers are exposed to ambient fab environment 139), and a front end transfer robot of wafer transfer system 112a, which is disposed within the housing 102, removes one or more wafers 101 from the opened wafer carrier 116. The first transfer robot of wafer transfer system 112a then moves the wafers 101 directly from the wafer carrier 116 through the input port 114 onto a wafer cart 140c, which is part of gantry system 122. In the illustrated embodiment, the wafer cart 140c rests on one or more rails (e.g., pair of linear rails 140a, 140b) which extend in parallel with one another within the processing chamber 105.

Alternatively, rather than simply passing the wafers 101 directly from the wafer carrier 116 through the input port 114 to the wafer cart 140c, a series of load locks can alternatively be present to help reduce contamination within the housing 102. For example, in alternative approaches, a wafer 101 can initially be transferred from the wafer carrier 116 into an outer load lock portal when the clear glass or polymer door is opened. During this initial transfer, an inner load lock portal within the housing remains closed to retain down-flow for the processing chamber 105 of the automated inspection tool 100. After the wafers 101 have been loaded into the outer load lock portal, the clear glass or polymer door is closed, and an inner load lock portal (which allows entry of the wafers into the processing chamber 105) is then opened. The wafers 101 are then loaded through the inner load lock portal and onto the wafer cart 140c, after which the inner load lock portal is closed.

In some embodiments, this wafer transfer is carried out by wafer transfer system 112a which includes one or more robotic arms. The one or more robotic arms transfer wafers 101 from the wafer carrier 116 to and from the various systems/assemblies in the automated inspection tool 100. The wafers 101 are typically loaded in the wafer cart 140c so their front side, on which semiconductor devices are formed, is facing upwards, while their backside, which is typically devoid of semiconductor device, is facing downward, but in other embodiments the wafers would be placed so their backside faces up and their front side faces down. The gantry system 122 then moves the wafer cart 140c and its wafer(s) between the OCR assembly 110, the backside macro-inspection system 103, and the front side macro-inspection system 104. A second wafer transfer system 112b with a second robotic arm transfers wafers between the gantry system 122 and the vacuum chamber 115, which corresponds to the front side micro-inspection system 106. In other embodiments, each wafer transfer assembly can have one or more separate robotic arms.

In some embodiments, each wafer transfer system 112a, 112b includes multiple robotic arms. In some embodiments, a robotic arm comprises a blade portion configured to be inserted under a bottom face of the wafer 101, thereby being able to lift and move the wafer. In some embodiments, the blade portion includes sensors to enhance the positioning of the blade portion with respect to wafer 101 to prevent scratching a surface of wafer 101. In some embodiments, the blade portion is substantially U-shaped to minimize the amount of contact between the blade portion and the wafer. In other embodiments, the blade portion is circular, rectilinear or another suitable shape for supporting and moving wafer 101. Because the wafer transfer system 112a/112b removes the need for manual transportation of the wafers, the wafer transfer system 112a/112b increases production yield and decreases production cost.

In use, wafer transfer system 112a loads wafer 101 onto gantry system 122. Gantry system 122 comprises a pair of rails 140a, 140b with one or more wafer carts 140c or chucks on which the wafer transfer system 112a places wafer 101. The wafer cart 140c has a drive mechanism, such as rollers, gears, belts, conveyors, or magnets for example, that move the wafer cart along the pair of rails between the various assemblies and/or wafer transfer systems within housing 102. In the embodiment of FIG. 2, the pair of rails 140a, 140b extend in parallel to a front side of the housing 102, and a wafer is loaded in a first direction through the input port 114 into the automated inspection tool, and then is moved on the wafer cart 140c in a second direction which is perpendicular to the first direction.

Referring back to FIG. 3, at 304, a determination is made if backside macro-inspection is to be carried out on a backside of the wafer. If so (YES at 304), the backside macro-inspection is carried out in 305. In some embodiments, if carried out, backside macro-inspection 305 is made up of a two distinct stages: a transfer of one or more wafers to the backside macro-inspection system (306), and identification of macro defects on the backside of the wafer (308).

Figure 3:
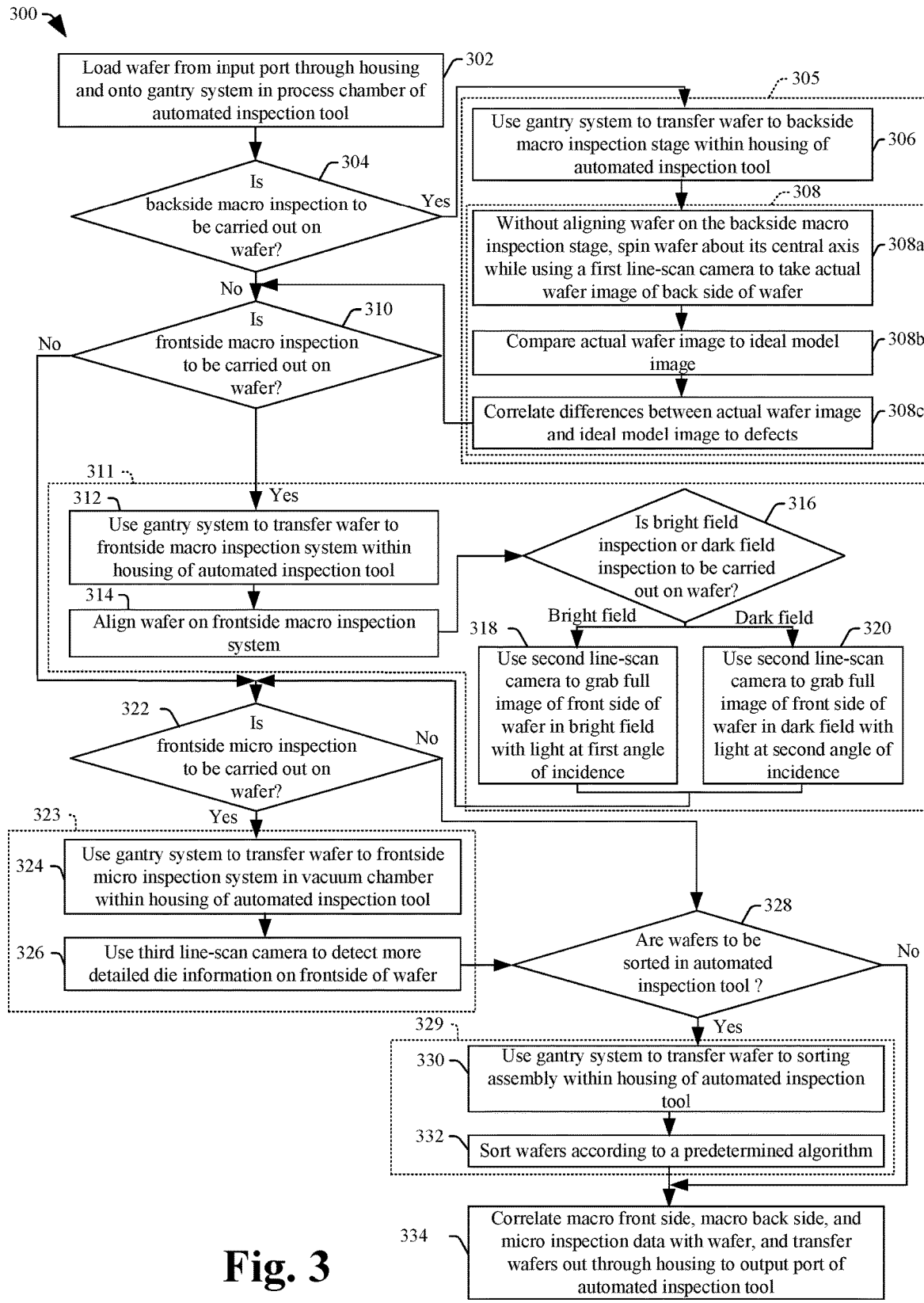
FIG. 3 is a flow chart of a method of using an automated inspection tool in accordance with one or more embodiments.
Figure 4:
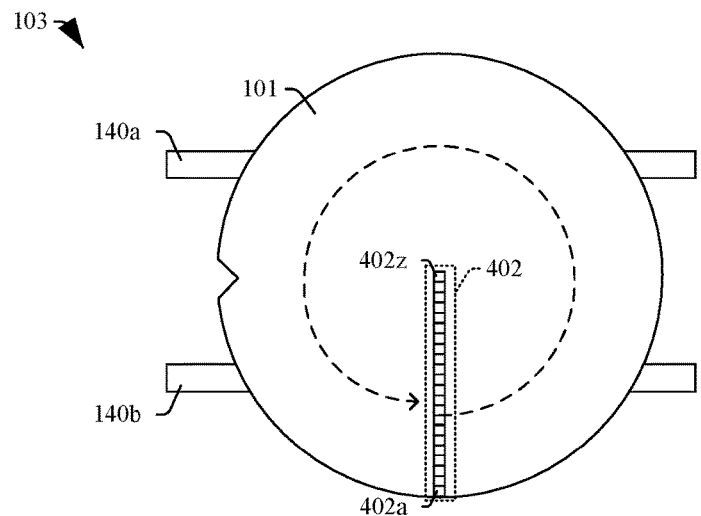
FIG. 4 is a top view of a macro imaging system used to image a backside of a wafer, in accordance with one or more embodiments.

Referring to FIGS. 2-3 concurrently, a first step in backside macro-inspection (FIG. 3: 306) can be carried out, as illustrated in FIG. 2, when the wafer cart 140c of gantry system 122 transfers the wafer 101 to a backside macro-inspection system 103 within housing of the automated inspection tool. Then, a second step in backside macro-inspection (FIG. 3, 308a) can be carried out when, without aligning the wafer 101 within the backside macro-inspection system 103, the wafer 101 is spun about its central axis while a first line-scan camera 402 is used to scan the backside of the wafer 101 and identify macro defects on a backside of wafer. The first line-scan camera 402 is arranged on the gantry system 122 so the first line-scan camera 402 is arranged under the backside of the wafer 101, such that the wafer can pass continually along the gantry system without having to be flipped between the backside macro-inspection system 103 and front side macro-inspection system 104. As can be seen by FIG. 4, the first line-scan camera 402 includes a line of pixels (e.g., 402a, . . . 402z), which are arranged along a radius of the wafer 101. Thus, when the wafer 101 is axially rotated so the backside of the wafer is over the first line-scan camera 402 (and/or the first line-scan camera 402 is rotated about the central axis of the wafer), the first line-scan camera 402 radially images the backside of the wafer. Thus, FIG. 4 represents one manner of how the actual wafer image of the back side of the wafer can be taken.

Figure 5:
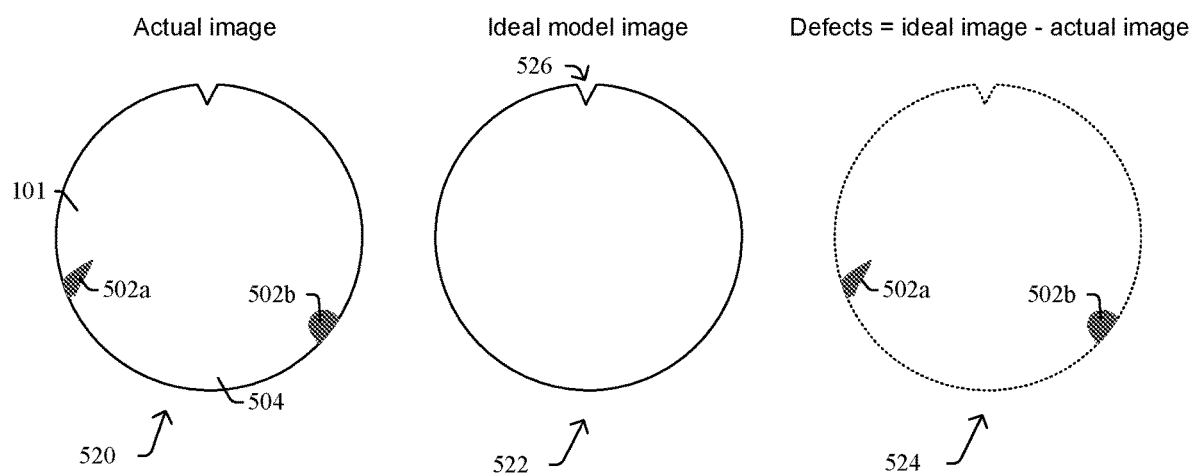
FIG. 5 depicts a series of images illustrating how a macro imaging system can be used to image the front side or the backside of a wafer, in accordance with one or more embodiments.

In step 308b of FIG. 3, the actual wafer image of the backside of the wafer is compared to an ideal wafer image. FIG. 5 shows an example of how this step may be carried out. As shown in FIG. 5, the actual wafer image of the backside of the wafer (520) may be taken by the first line-scan camera 402. In some cases, the macro defects in this actual wafer image may manifest as relatively dark features 502a, 502b over a relatively light background field

504 of the wafer. The macro defects identified on the backside of the wafer may have minimum sizes of approximately 30 microns in some embodiments. Thus, macro defects which are 30 microns or greater in size can appear with clear and distinct edges, whereas other features smaller than 30 microns may appear blurry and/or fuzzy and are not readily discernable.

In step 308c in FIG. 3, the actual image of the wafer backside may then be compared to an ideal model image of the wafer backside. The ideal model image may be based solely on the layout of the wafer and/or may account for some expected lithography effects, but does not include any defects or particle contaminants. FIG. 5 shows an example where the backside of the wafer is devoid of semiconductor devices, and thus the ideal model image 522 is a continuous wafer surface without any scratches or circuitry features, other than a wafer notch 526. As shown in the right-hand image of FIG. 5, the difference between the actual wafer image 520 and the ideal model image 522 can allow position data 524 regarding the defects 502a, 502b to be extracted.

Referring back to FIG. 3, at 310, a determination is made if macro-inspection is to be carried out on a front side of the wafer. If so, front side macro-inspection is carried out at 311.

If front side macro-inspection is to be carried out (YES at 310), at 312 the gantry system transfers the wafer to a front side macro-inspection stage within the housing of the automated inspection tool. This can, for example, correspond to FIG. 2, moving a wafer 101 to front side macro-inspection system 104.

Next, at 314 in FIG. 3, the wafer is aligned within the front side macro-inspection system 104, for example, using the alignment notch on wafer. At 316, the method determines whether bright field inspection or dark field inspection is to be carried out on the wafer. In switching between bright field inspection and dark field inspection, the angle of incident light (relative to the front side of the wafer) provided by a light source is moved between two angles to achieve different imaging of the front side of the wafer.

If bright field inspection is to be carried out, then in 318, a second line-scan camera is used to grab a full image of the front side of the wafer using bright field inspection, typically without rotating the wafer. This can be seen for example in FIG. 2, in which wafer 101 within front side macro-inspection system 104 is imaged by a second line-scan camera 602 while the wafer 101 is translated as shown by path 152, rather than being spun about its axis. The second line-scan camera 602 is a line scan camera having a linear viewing length that is greater than or equal to a diameter of the wafer, and the linear viewing length is perpendicular to the one or more rails. FIG. 6 shows another example of a front side macro-inspection system 104 that includes a wafer cart 140c on rails 140a, 140b, a second line-scan camera 602, a light source 604, and a reflecting mirror 606. During bright field inspection, the second line-scan camera 602 records an image of the wafer 101 based on light reflected from wafer 101 as the wafer cart 140c translates the wafer 101 according to path 152. The wafer 101 is translated so a center of the wafer is moved a distance greater than or equal to the diameter of the wafer as the second line-scan camera 602 performs imaging. The wafer translates along a line (e.g., 152) that is perpendicular to a line of pixels for the second line-scan camera 602.

During bright field inspection, incident light to illuminate the front side 101s of the wafer 101 is directed downward onto the wafer with a first angle of incidence, (FIG. 7, $\theta_1$). The angle of incidence $\theta_1$ is the angle between incident light impinging on the front side of the wafer and the line perpendicular to the front side at the point of incidence, called the normal. The first angle of incidence $\theta_1$ is substantially zero degrees in some embodiments, and can range from zero degrees to forty degrees in some embodiments. As can be seen from the reflected light rays in FIG. 7, during bright field inspection, the top planar surface of the wafer 101 tends to reflect light upwards towards mirror 606 and into the second line-scan camera 602, which gives rise to a "light" background region for the wafer image (see ray 702), while non-planar particles, scratches, or defects tend to scatter light giving rise to "dark" regions (see ray 704).

If dark field inspection is to be carried out, then in 320 of FIG. 3, the second line-scan camera is used to grab a full image of the front-side of the wafer in using dark field inspection with light at a second angle of incidence.

As can be seen in FIG. 8, during dark field inspection, incident light to illuminate the front side of the wafer is directed downward onto the wafer 101 with a second angle of incidence $\theta_2$, which is greater than the first angle of incidence ($\theta_1$, FIG. 7). The second angle of incidence $\theta_2$ can range from 30 degrees to nearly ninety degrees in some embodiments, such that the incident light "skims" the front surface 101s of the wafer. Because of the large second angle of incidence $\theta_2$, the planar upper surface of the wafer appears as a "dark" region (see ray 706) while defects in the wafer may appear as "light" regions (see ray 708). Thus, the dark field imaging may be thought of as a "negative" of the bright field imaging, albeit that the dark field imaging is able to detect the small surface defects with a higher degree of resolution than the bright field imaging.

Not every layer on a wafer receives both bright field inspection and dark field inspection. For example, a photoresist mask may be imaged using only bright field inspection, while a layer that was just etched may be imaged using only dark field inspection. Thus, by using bright field inspection and/or dark field inspection, macro defects on the front side of a wafer are identified and catalogued. This option between the two inspection techniques provides for a very high resolution of the wafer, and thus, is advantageous.

Referring back to FIG. 3, at 322, a determination is made if micro-inspection, which has higher resolution than macro-inspection, is to be carried out on the front side of the wafer. If so (YES at 322), front side micro-inspection is carried out at 323.

More particularly, at 324, the gantry system is used to transfer the wafer to a front side micro-inspection stage within the housing of the automated inspection tool. In the example of FIG. 2, the front side micro-inspection system 106 is housed within a vacuum chamber 115 that is kept at low pressure. Thus, after being processed by one or more of the backside macro-inspection system 103 and/or front side macro-inspection system 104, a second transfer robot of the wafer transfer system 112b can pick-up the wafers 101. A chamber portal can be opened and closed to isolate the vacuum chamber 115 from the processing chamber 105. For example, the chamber portal of the front side micro inspection system 106 can then be opened, and one or more wafers 101 can be placed by the second transfer robot (e.g., 112b) into vacuum chamber 115 of the front side micro micro-inspection system 106. The chamber portal of the front side micro inspection system can then be closed, and the vacuum chamber 115 can be pumped down to vacuum, and front side micro-inspection can be carried out.

At 326, the front-side micro-inspection stage, which has a third line-scan camera, images and detects more detailed die information on front side of wafer, after the front-side micro-inspection stage has been pumped down to vacuum.

In FIG. 2, a third line-scan camera 160 is mounted within the front-side micro-imaging system 106, which can move the third line-scan camera 160 in the x-, y, and z-directions in stepped increments to obtain high resolution images of the front side of the wafer 101. The resolution of the third line-scan camera 160 is higher than a resolution of the first line-scan camera 402, and is higher than a resolution of the second line-scan camera 602. After micro-inspection, the chamber portal to the front side micro inspection system 106 can be re-opened, and the second transfer robot of the wafer transfer system 112b can again place the wafers back onto the gantry system 122.

Figure 9:
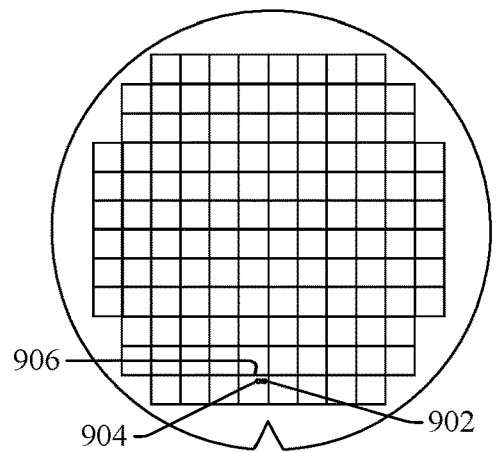
FIG. 9 depicts an example of a micro imaging defect report, in accordance with one or more embodiments.
Figure 10:
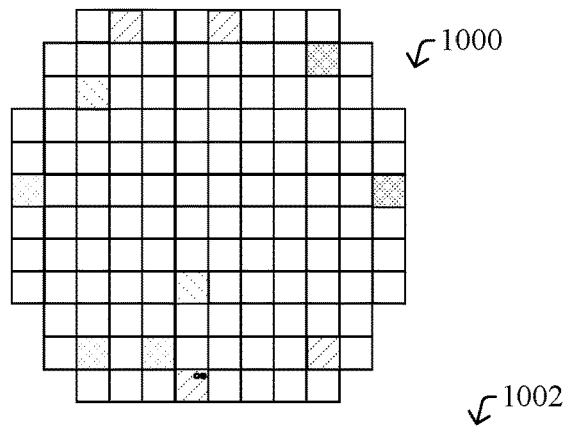
FIG. 10 depicts an example of a micro imaging defect report, in accordance with one or more embodiments.

During micro-inspection, the actual front-side wafer micro image, which may include micro defects, and an ideal model image, which is free of micro defects, are aligned by the use of pattern matching. For example, after the actual front-side wafer micro image is obtained, a software algorithm can align features in the actual wafer image with that those of the ideal model image—for instance, scribe lines of the actual wafer image can be aligned with scribe lines in the ideal model image so individual die in the actual wafer image are aligned with those on the ideal model image. The individual die area of the actual front-side wafer micro image is compared to the corresponding die area for the ideal model image, thereby detecting micro defects in the die area of the actual wafer image. The number of micro defects, as well as the size of each micro defect, location of each micro defect, and type of each micro defect is stored. For example, FIG. 9 shows an example where two micro defects 902, 904 are identified within a die area 906. In this example, the micro defects 902, 904 are identified to determine a defect code 908 for each defect, wherein the defect code can specify whether each defect is an arcing micro defect 906, a scratch micro defect 908, or a chipping micro defect 910, among others. The size of each micro defect 910 and location (e.g., x-coordinate and y-coordinate 912) of each micro defect is also stored. Other die areas for the wafer are analyzed in the same way, and a die map is generated for the wafer. FIG. 10 shows an example of a die map 1000. In this die map, each die is illustrated, and the die are color-coordinated based on the quantity and/or type of micro defect detected on each die. Each micro defect is also listed in a table 1002 below the die map. For example, as shown in the table, two micro defects have been detected on die number 5, and the size of each of these micro defects, as well as the location of each of these micro defects along with a defect code for each defect is listed.

Referring to FIG. 3, at 328, a determination is made if the wafers are to be sorted while within the housing of the automated inspection tool. If so, sorting of the wafers is carried out at 329. More particularly, at 330, the gantry system is used to transfer the wafer to the optical character recognition (OCR)/sorting stage within the housing of automated inspection tool. In FIG. 2, the OCR assembly 110 and/or sorting assembly 108 include an imaging camera 180 that images a wafer identifier, which is made up of a series of alphanumeric characters. OCR software then processes the raw image of the wafer identifier and determines the alphanumeric characters in the image. Thus, whereas the raw image includes an array of pixels in an image format (e.g., jpeg, tiff, etc.), the OCR software analyzes the pixels of the raw image, and extracts a string that is stored as a software variable for easy identification and tracking of the wafer.

The imaging camera 180 of the OCR assembly 110 can be arranged in various locations within the automated inspection tool. For example, if the wafers 101 are 200 mm wafers, the OCR assembly 110 typically includes a front side camera arranged above the top face of the wafer, and which images a wafer identifier on the upper side (e.g., active device side) of the wafer 101. In other embodiments where the wafers 101 are 300 mm wafers, one or more wafer identifiers may be disposed on the backside of the wafer 101, and as such, the OCR assembly 110 can alternatively include a backside camera under the lower face of the wafer 101.

In some embodiments, the automated inspection tool can also include a scan module for scanning a barcode or other marking attached to each wafer 101. This scan module can be in addition to and/or in place of the OCR assembly 110. Scan module scans a barcode or marking upon wafer 101 entering the automated inspection tool. Scan module transmits the scanned barcode or marking to a computer system to allow tracking of wafers 101 throughout the production process. The ability to track wafers 101 throughout the production process allows production errors to be located and corrected rapidly.

Referring back to FIG. 3, the wafers are then sorted according to a pre-determined algorithm in 322. In some embodiments, the wafer carrier includes a series of slots (e.g., 25 slots), with each slot sized to receive an individual wafer. As shown in FIG. 2, the sorting assembly 108 also includes a series of slots 170, which in the illustrated embodiment are stacked one over another, with each slot 170 sized to receive a wafer. Thus, in some embodiments, the wafers 101 can be sorted so they are ultimately placed back into slots in the wafer carrier 116 so a first wafer 101a, which is placed in a slot nearest one end of the wafer carrier 116, has the lowest wafer identifier of the wafers in the wafer carrier, and a second wafer 101b, which is placed in a slot nearest the opposite end of the wafer carrier 116, has the highest wafer identifier of the wafers in the wafer carrier; and where the wafers have wafer identifiers that increase monotonically from the one side of the wafer carrier 116 to the other side of the wafer carrier 116. When successive wafers are processed by the automated inspection tool and their wafer identifiers are out of sequential order, which can happen for any number of reasons, the automated inspection tool can temporarily put an out-of-order wafer in a slot of the sorting assembly 108, rather than putting the wafer directly into the wafer carrier 116. Then, while the out-of-order wafer resides in the sorting assembly 108, other wafers whose wafer identifiers fall within a wafer identifier range to be placed in the wafer carrier 116, can be placed into the wafer carrier in slots that correspond to their places in the wafer identifier sequence. Eventually, when the out-of-order wafer falls into a range of wafer identifiers for a given wafer carrier, the out-of-order wafer is placed into appropriate wafer carrier. In other embodiments, rather than the wafer carriers being arranged by sequential wafer identifiers, a first wafer with the fewest number of defects is placed nearest the first end of the wafer carrier 116 while a second wafer with the largest number of defects is placed nearest the second end of the wafer carrier 116, etc. Further, in come embodiments, sorting may include identifying any wafers which have more than some threshold level of defects, and selectively discarding of those wafers by putting them in a wafer carrier reserved for overly defective wafers.

Notably, depending on the state of processing in the various assemblies/chambers and other wafers waiting to be processed, the first wafer transfer system 112a may place the processed wafers 101 into the sorting assembly 108 until an opportune time arrives to route the wafers back out of the input/output port 114. Alternatively, the wafers 101 may be placed into the sorting assembly 108 before being processed, for example, until a processing chamber is available. The sorting assembly 108 may include a wafer rack that includes a plurality of slots 170 or recesses configured to hold individual wafers 101. For example, in FIG. 2, the wafer rack is illustrated as having vertical sidewalls and horizontal protrusions extending outwardly from the vertical sidewalls. Vertical slots 170 between neighboring protrusions are greater than the thickness of a wafer, such that individual wafers 101 can be stacked in the slots or recesses, respectively, one over another. In some examples, wafers from three lots are stored in the sorting assembly 108 concurrently. Often, all wafers of a same lot are moved into the automated inspection tool together through a single use of input/output port 114.

The wafer rack in the sorting assembly 108 has a sufficient number of slots 170 to hold wafers of multiple lots concurrently. In some embodiments, fewer wafers can be grouped in each lot in order to improve queue time. In some embodiments, there is one to one, or two to one, correspondence such that a number of wafers in a lot corresponds to the number of assemblies/systems in the automated inspection tool. For example, for a processing tool having four assemblies (e.g., OCR assembly, front side macro-inspection assembly, back side macro-inspection system, and front side micro-inspection system), four or eight wafers can be grouped in one lot and there are partial or dedicated lots in which only one or two wafers are placed. For example, the wafer rack can hold twenty-eight or more wafers. This provides sufficient storage to allow wafers to be flexibly processed within the automated inspection tool 100 in a pipelined fashion while the input/output port 114 can be opened to insert/remove lots of wafers respectively. This helps to improve throughput, and also reduces potential contamination which can enter processing chamber of the automated inspection tool from the ambient fab environment 139 through the input/output port 114.

At 334, the front side macro imaging data, back side macro imaging data, and micro imaging data are correlated with each wafer; and the wafers are transferred out of the housing of the automated inspection tool and to the output port of the automated inspection tool. This data is tabulated, for example in the form of a report for each wafer, and is ultimately sent on to a customer along with the wafers.

Figure 11:
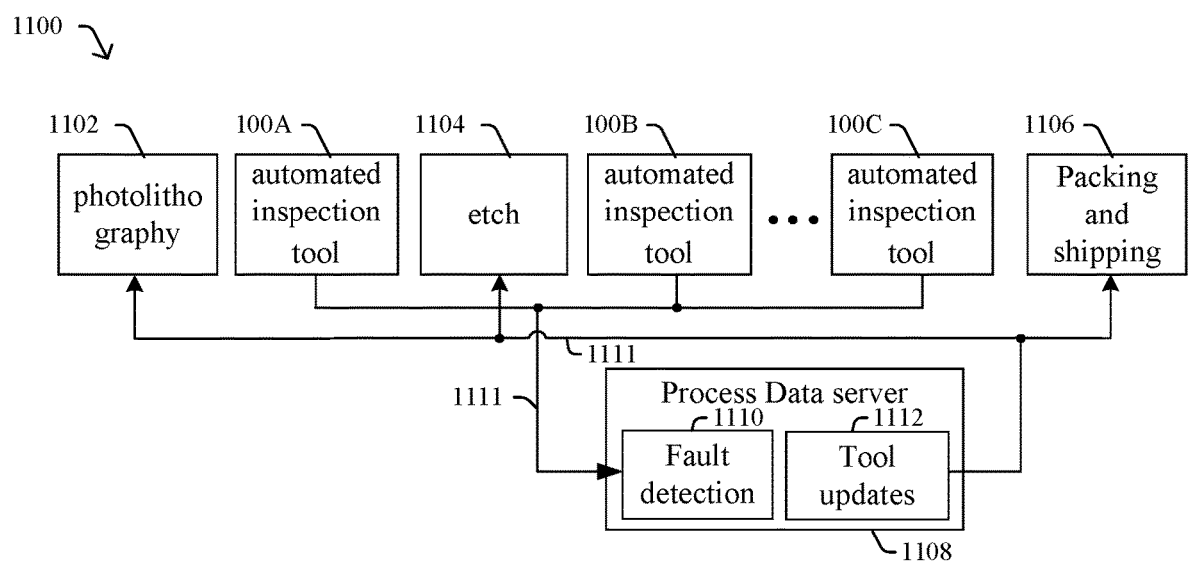
FIG. 11 is a block diagram of a semiconductor fabrication facility which includes a number of automated inspection tools in accordance with one or more embodiments.

FIG. 11 shows how a number of automated inspection tools (e.g., FIG. 1, 100) can be arranged within an IC fabrication facility 1100 to aid in manufacturing. The automated inspection tool 100 is particularly advantageous for evaluating finished wafers just before the wafers are packaged and shipped, but it will also be appreciated that these automated inspection tools can also be arranged at other locations in the IC fabrication facility 1100 to help characterize the fabrication process and characterize wafers undergoing fabrication. The illustrated portion of the IC fabrication facility 1100, which is simplified for purposes of understanding, includes a photolithography system 1102, an etching system 1104, and packaging and shipping systems 1106. A first automated inspection tool 100A is arranged between the photolithography system 1102 and the etching system 1104, a second automated inspection tool 100B is arranged downstream of the etching system 1104, and a third automated inspection tool 100C is arranged upstream of the packing and shipping system 1106.

After processing is completed at each system 1102-1106, one or more robotic arms at that system removes one or more wafers 101 from the system and stores the wafer(s) 101 in a wafer carrier 116. A conveyor or other transfer assembly then moves the wafer carriers 116 with their enclosed wafers 101 between each system 1102-1106, to allow robotic arms associated with each system 1102-1106 to continue loading and removing wafers 101 without being touched by human workers.

A process data server 1108, which can include a controller and memory, is operably coupled to the systems 1102-1106 and inspection tools 100A-100C through communication channels 1111, such as fiber optic lines, coaxial cable, copper wiring, and/or wireless signals, for example. The process data server 1108 includes fault detection logic 1110 to gather data from the automated inspection tools 100A-100C and identify a problematic tool where faults are likely occurring in the IC fabrication facility. For example, if the photolithography system 1102 is operating out of specified ranges (e.g., is acting as a problematic tool), the automated inspection tool 100A may report wafer defects that establish a pattern of behavior that suggest the photolithography system 1102 is behaving poorly. In response to this pattern, tool update logic 1112 within the process data server 1110 can either itself adjust parameter and/or operating routines of the photolithography system 1102, or can alert a technician of the suspected problem so that the technician to physically visit the device to further analyze (and ideally fix) any issues. The automated inspection tools 100A-100C provide a wide range of measurements with little or no human intervention needed, and thus serve as an efficient mechanism for identifying defects as they arise in the fabrication facility. Moreover, previous approaches in this arena have been extremely labor intensive while the disclosed automated inspection tools run largely autonomously and are capable of characterizing a large number of wafers in a relatively short time span.

The above description discloses exemplary steps, but they are not necessarily required to be performed in the order described. Steps can be added, replaced, changed in order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

Thus, some embodiments of the present disclosure relate to a processing tool. The tool includes a housing enclosing a processing chamber, and an input/output port configured to pass a wafer through the housing into and out of the processing chamber. A back-side macro-inspection system is arranged within the processing chamber and is configured to image a back side of the wafer. A front-side macro-inspection system is arranged within the processing chamber and is configured to image a front side of the wafer according to a first image resolution. A front-side micro-inspection system is arranged within the processing chamber and is configured to image the front side of the wafer according to a second image resolution which is higher than the first image resolution.

Other embodiments relate to a method in which a wafer is passed from an ambient fab environment into a processing chamber of an automated inspection tool. While the wafer is in the processing chamber, a back-side macro imaging operation is performed on the wafer and a front-side macro imaging operation is performed on the wafer at a first image resolution. The wafer is transferred from the processing chamber into a vacuum chamber without re-exposing the wafer to the ambient fab environment. While the wafer is in the vacuum chamber, a front-side micro imaging operation is performed on the wafer at a second image resolution, which is higher than the first image resolution.

Other embodiments relate to a processing tool that includes a housing enclosing a processing chamber of the processing tool. An input/output port is included in a sidewall of the housing and is configured to pass wafers into and/or out of the processing chamber within the housing. A first wafer transfer system includes a first robotic arm to transfer the wafers from the input/output port into the processing chamber. A gantry system is arranged within the processing chamber and is configured to receive the wafers from the first wafer transfer system. A back-side macro-inspection system is arranged along the gantry system within the processing chamber and includes a first line-scan camera. The wafers are transported by the gantry system so as to pass over the first line-scan camera such that the first line-scan camera images the back side of the wafers. A front-side macro-inspection system is arranged along the gantry system within the processing chamber and includes a second line-scan camera. The wafers are transported by the gantry system so as to pass under the second line-scan camera such that the second line-scan camera images the front side of the wafers.

Still other embodiments relate to a method. In this method, a wafer is passed from an ambient fab environment into a processing chamber of an automated inspection tool. While the wafer is retained in the processing chamber, a back-side macro imaging operation is performed on the wafer by axially rotating a first line scan camera and/or the wafer about an axis passing through a center of the wafer to thereby provide a back-side image of the wafer at a first image resolution. While the wafer is retained in the processing chamber, a front-side macro imaging operation is performed the wafer by laterally translating the wafer in a direction perpendicular to linear viewing field of a second line scan camera to thereby provide a front-side image of the wafer. The back-side image of the wafer or the front-side image of the wafer is compared to an ideal model image to determine whether a chipping defect, a scratch defect, or a non-uniform coating defect is present on the wafer.

Yet other embodiments relate to a method of processing wafers. This method uses a first wafer transfer system, which includes a first robotic arm, to transfer wafers from a wafer carrier in an ambient fab environment into a processing chamber of a processing tool. A down-drafting gas flow is provided in the processing chamber and is exhausted to direct contaminants downward in the processing chamber and away from upper surfaces of the wafers. A back-side macro imaging operation and a front-side macro imaging operation are performed on the wafers while the wafers are retained in the processing chamber and while the down-drafting gas flow is provided. A second wafer transfer system, which includes a second robotic arm, is used to transfer the wafers from the processing chamber into a vacuum chamber residing within the processing tool. The wafers are so a first wafer, which is placed in a first slot nearest one end of the wafer carrier, has a lowest wafer identifier of the wafers, and a second wafer, which is placed in a second slot nearest an opposite end of the wafer carrier, has a highest wafer identifier of the wafers in the wafer carrier. The wafers have wafer identifiers that increase monotonically from the first slot to the second slot.

Still other embodiments relate to a processing tool including a housing enclosing a processing chamber. An input/output port is configured to pass a wafer from a wafer carrier through the housing into and out of the processing chamber. A macro-inspection system arranged within the processing chamber is configured to image a front side and/or a back side of the wafer according to a first image resolution. A front-side micro-inspection system arranged within the processing chamber is configured to image the front side of the wafer according to a second image resolution which is higher than the first image resolution. A sorting assembly with a number of slots stacked one over another, with each slot sized to receive a wafer, is configured to sort the wafers so a first wafer, which is placed in a first slot nearest one end of the wafer carrier, has a lowest wafer identifier of the wafers in the wafer carrier, and a second wafer, which is placed in a second slot nearest an opposite end of the wafer carrier, has a highest wafer identifier of the wafers in the wafer carrier. The wafers have wafer identifiers that increase monotonically from the one end of the wafer carrier to the opposite end of the wafer carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   passing a wafer from an ambient fab environment into a processing chamber of an automated inspection tool;
   while the wafer is retained in the processing chamber, performing a back-side macro imaging operation on a back-side of the wafer with a first camera to thereby provide a back-side image of the wafer at a first image resolution;
   while the wafer is retained in the processing chamber, performing a front-side macro imaging operation on a front-side of the wafer with a second camera to thereby provide a front-side image of the wafer;
   comparing the back-side image of the wafer or the front-side image of the wafer to an ideal model image to determine whether a chipping defect, a scratch defect, or a non-uniform coating defect is present on the wafer; and
   providing a down-drafting gas flow in the processing chamber and exhausting the down-drafting gas flow to direct contaminants downward in the processing chamber and away from an upper surface of the wafer, wherein the back-side macro imaging operation and the front-side macro imaging operation occur while the down-drafting gas flow is provided.

2. The method of claim 1, wherein the chipping defect is determined to be on the back-side of the wafer based on a comparison between the back-side image of the wafer and the ideal model image.

3. The method of claim 1,
   transferring the wafer from the processing chamber directly into a vacuum chamber within the processing chamber; and
   while the wafer is in the vacuum chamber, performing a second front-side micro imaging of the wafer at a second image resolution, which is higher than the first image resolution.

4. The method of claim 1, wherein the front-side macro imaging operation comprises-laterally translating the wafer in a direction perpendicular to a linear viewing field of the second camera, and further comprising:

transferring the wafer along one or more rails to perform the back-side macro imaging operation and the front-side macro imaging operation such that the wafer remains continuously engaged on the one or more rails during the back-side macro imaging operation and the front-side macro imaging operation.

5. The method of claim 4, wherein the one or more rails extend in the direction in which the wafer is laterally translated.

6. The method of claim 1, further comprising:

while the wafer is in the processing chamber, performing an optical character recognition (OCR) operation to read a wafer identification code on the wafer.

7. The method of claim 1, wherein the back-side macro imaging operation comprises axially rotating the first camera and/or the wafer about an axis passing through a center of the wafer.

8. The method of claim 3, wherein the first image resolution identifies macro defects on the front-side of the wafer which have minimum sizes of approximately 30 microns, and wherein the second image resolution identifies microdefects on the front-side of the wafer which have minimum sizes of less than 30 microns.

9. A method of processing wafers, comprising:

using a first wafer transfer system including a first robotic arm to transfer wafers from a wafer carrier in an ambient fab environment into a processing chamber of a processing tool;

performing a back-side macro imaging operation and a front-side macro imaging operation of the wafers while the wafers are retained in the processing chamber, wherein at least one of the back-side macro imaging operation and the front-side macro imaging operation performs imaging of the wafers using a first image resolution;

using a second wafer transfer system including a second robotic arm to transfer the wafers from the processing chamber into a vacuum chamber residing within the processing tool;

while the wafers are in the vacuum chamber, performing a front-side micro imaging of the wafers at a second image resolution, which is higher than the first image resolution; and after the front-side micro imaging is performed, sorting the wafers so a first wafer of the wafers, which has a first wafer identifier, is placed in a first slot nearer to a first end of the wafer carrier, and a second wafer of the wafers, which has a second wafer identifier, is placed in a second slot nearer a second end of the wafer carrier opposite the first end; and wherein the first and second wafers are sorted so the first and second wafer identifiers follow a pre-determined ordering when the first and second wafers are placed in the first and second slots, respectively.

10. The method of claim 9, further comprising:

comparing a back-side image of the first wafer or a front-side image of the first wafer to an ideal model image to determine whether a chipping defect, a scratch defect, or a non-uniform coating defect is present on the first wafer.

11. The method of claim 9, further comprising:

providing a down-drafting gas flow in the processing chamber and exhausting the down-drafting gas flow to direct contaminants downward in the processing chamber and away from upper surfaces of the wafers, wherein the back-side macro imaging operation and the front-side macro imaging operation occur while the down-drafting gas flow is provided.

12. The method of claim 9, wherein the first image resolution identifies macro defects on a front-side of the first or second wafer which have minimum sizes of approximately 30 microns, and wherein the second image resolution identifies microdefects on the front-side of the first or second wafer which have minimum sizes of less than 30 microns.

13. A processing tool, comprising:

a housing enclosing a processing chamber;

an input/output port configured to pass a wafer from a wafer carrier through the housing into and out of the processing chamber;

a macro-inspection system arranged within the processing chamber and configured to image a back side of the wafer according to a first image resolution; and a front-side micro-inspection system arranged within the processing chamber and configured to image a front side of the wafer according to a second image resolution which is higher than the first image resolution, the front side of the wafer being opposite the back side of the wafer;

wherein macro defects on the front side of the wafer which have minimum sizes of approximately 30 microns are identified based on the first image resolution, and wherein microdefects on the front side of the wafer which have minimum sizes of less than 30 microns are identified based on the second image resolution.

14. The processing tool of claim 13, further comprising:

a sorting assembly with a number of slots stacked one over another with each slot sized to receive a wafer, wherein the sorting assembly is configured to sort the wafers so a first wafer having a first wafer identifier is placed in a first slot proximate to a first end of the wafer carrier and a second wafer having a second wafer identifier is placed in a second slot proximate to a second end of the wafer carrier; and wherein the sorting assembly is configured to sort the wafers so the first and second wafer identifiers follow a pre-determined ordering when placed in the slots.

15. The processing tool of claim 13, further comprising:

evaluation circuitry configured to provide a wafer report along with each wafer, wherein each wafer report specifies a number of defects for each die, a type of defect for each of the number of defects, a size of each of the number of defects, and a location of each of the number of defects.

16. The processing tool of claim 15, further comprising:

an optical character recognition (OCR) system retained within the housing, and configured to read a wafer identification code of the wafer which has been passed into the processing chamber of the housing, wherein the wafer identification code is included in the wafer report.

17. The processing tool of claim 13, wherein the macro-inspection system comprises:

an imaging camera;

a light source configured to direct light towards the wafer according to a first angle of incidence and a second angle of incidence; and a mirror configured to redirect light from the front side of the wafer towards the imaging camera.

18. The processing tool of claim 13, further comprising a down-draft assembly disposed within the housing, the down-draft assembly comprising:

a gas flow assembly configured to provide gas flow from a showerhead in an upper region of the processing chamber; and an exhaust assembly configured to pull the gas flow from a bottom region of the processing chamber, such that the gas flow assembly and the exhaust assembly induce a downward gas flow that directs particles downward and away from an upper surface of the wafer.

19. The processing tool of claim 13, wherein the front-side micro-inspection system includes a vacuum chamber within the processing chamber of the housing, wherein a chamber portal through which the wafer can pass separates the vacuum chamber from the processing chamber.

20. The processing tool of claim 13, wherein the macro-inspection system comprises a front-side macro-inspection system configured to image the front side of the wafer and a back-side macro-inspection system configured to image the back side of the wafer, and further comprising:

one or more rails extending continuously between the back-side macro-inspection system and the front-side macro-inspection system; and a wafer cart configured to engage the wafer and to move along the one or more rails to transfer the wafer from the back-side macro-inspection system to the front-side macro-inspection system.

* * * * *